(12) United States Patent
Lai et al.

(10) Patent No.: US 8,912,656 B2
(45) Date of Patent: Dec. 16, 2014

(54) INTEGRATED CIRCUIT PACKAGE AND PHYSICAL LAYER INTERFACE ARRANGEMENT

(75) Inventors: Wei-Chih Lai, New Taipei (TW); Jiang Fan, Beijing (CN)

(73) Assignee: VIA Technologies, Inc., New Taipei (TW)

( * ) Notice: Subject to any disclaimer, the term of this patent is extended or adjusted under 35 U.S.C. 154(b) by 304 days.

(21) Appl. No.: 13/050,945

(22) Filed: Mar. 18, 2011

(65) Prior Publication Data

US 2012/0126398 A1 May 24, 2012

(30) Foreign Application Priority Data

Nov. 23, 2010 (CN) .......................... 2010 1 0555054

(51) Int. Cl.
*H01L 23/48* (2006.01)
*H01L 23/52* (2006.01)
*H01L 23/528* (2006.01)
*H01L 23/00* (2006.01)

(52) U.S. Cl.
CPC ............ *H01L 23/5286* (2013.01); *H01L 24/05* (2013.01); *H01L 24/06* (2013.01); *H01L 24/16* (2013.01); *H01L 2224/023* (2013.01); *H01L 2224/02375* (2013.01); *H01L 2224/0401* (2013.01); *H01L 2224/05569* (2013.01); *H01L 2224/05572* (2013.01); *H01L 2224/0612* (2013.01); *H01L 2224/06131* (2013.01); *H01L 2224/06134* (2013.01); *H01L 2224/06153* (2013.01); *H01L 2224/06155* (2013.01); *H01L 2224/06163* (2013.01); *H01L 2224/06165* (2013.01); *H01L 2224/06177* (2013.01); *H01L 2924/01033* (2013.01); *H01L 2924/01079* (2013.01); *H01L 2924/01005* (2013.01)
USPC ......... 257/773; 257/778; 257/786; 257/E23.02

(58) Field of Classification Search
CPC . H01L 23/50; H01L 23/552; H01L 23/49838; H01L 2224/16104; H01L 2224/16227; H01L 2224/16233; H01L 24/05; H01L 24/06
USPC .................... 257/773, 786, 737, 778, E23.02
See application file for complete search history.

(56) References Cited

U.S. PATENT DOCUMENTS

| | | | | |
|---|---|---|---|---|
| 5,686,764 A * | 11/1997 | Fulcher | ......................... | 257/778 |
| 5,691,568 A * | 11/1997 | Chou et al. | .................... | 257/691 |
| 5,952,726 A * | 9/1999 | Liang | ............................. | 257/778 |
| 6,008,543 A * | 12/1999 | Iwabuchi | ...................... | 257/778 |
| 6,107,685 A * | 8/2000 | Nishiyama | ..................... | 257/737 |
| 6,137,168 A * | 10/2000 | Kirkman | ....................... | 257/691 |
| 6,204,559 B1 * | 3/2001 | Lin et al. | ....................... | 257/738 |
| 6,211,576 B1 * | 4/2001 | Shimizu et al. | .............. | 257/786 |
| 7,227,254 B2 * | 6/2007 | Devnani et al. | .............. | 257/691 |
| 2003/0085469 A1* | 5/2003 | Yamada et al. | .............. | 257/773 |
| 2004/0216071 A1* | 10/2004 | Miller | ............................ | 716/12 |

* cited by examiner

*Primary Examiner* — Nitin Parekh
(74) *Attorney, Agent, or Firm* — Jianq Chyun IP Office

(57) ABSTRACT

An integrated circuit (IC) package includes an IC chip, a package carrier, and a plurality of conductive bumps connecting the IC chip to the package carrier. The IC chip includes a substrate and an IC layered structure configured on an active surface of the substrate. The active surface has a core area and a signal area surrounding the core area. The IC layered structure includes a first physical layer interface. The first physical layer interface includes a plurality of first bump pads and a plurality of first inner pads electrically connected to the first bump pads, respectively. The first inner pads are arranged in multiple rows in the signal area.

19 Claims, 6 Drawing Sheets

INTEGRATED CIRCUIT PACKAGE AND PHYSICAL LAYER INTERFACE ARRANGEMENT

CROSS-REFERENCE TO RELATED APPLICATION

This application claims the priority benefit of China application serial no. 201010555054.6, filed on Nov. 23, 2010. The entirety of the above-mentioned patent application is hereby incorporated by reference herein and made a part of this specification.

BACKGROUND OF THE INVENTION

1. Field of the Invention

The invention relates to a physical layer interface arrangement adapted to an integrated circuit (IC) chip.

2. Description of Related Art

An IC chip, in most cases, includes a substrate (e.g., a silicon wafer) and an IC layered structure configured on an active surface of the substrate. Here, the "active surface" refers to the surface of the substrate on which the IC layered structure is configured. In general, the IC layered structure includes a plurality of internal elements (e.g., MOS transistors, inductors, capacitors, and so on), a plurality of dielectric layers, and a plurality of patterned metal layers. The dielectric layers and the patterned metal layers are stacked to one another. The patterned metal layers allow signals of the internal elements to be transmitted to the external, and vice versa. Despite the arrangement of the internal elements and the patterned metal layers in the IC chip, the signals must be transmitted to the external or transmitted into the IC chip through the outermost portion of the IC layered structure. The outermost portion of the IC layered structure includes a core area and a signal area surrounding the core area. Here, the core area supplies core power and core ground, and the signal area supplies signals. In addition, the signal area further includes a plurality of physical layer interfaces that are arranged in a single row in the periphery of the core area. Signals with different functions are respectively transmitted through the physical layer interfaces. That is to say, each of the physical layer interfaces acts as a bridge for electrical connection between internal elements and external elements, and transmits the signal with the specific function. Under certain circumstances, the signals with the same function can be transmitted through several physical layer interfaces together.

In the IC chip manufactured by applying flip chip package technology, each physical layer interface of the outermost portion of the IC layered structure includes a plurality of bump pads that are arranged in accordance with the design rule. Besides, each of the physical layer interfaces further includes a plurality of inner pads and a plurality of redistribution lines. The inner pads and the redistribution lines are located below corresponding bump pads and in the IC layered structure. The inner pads are arranged in a single row, and the redistribution lines electrically connect the bump pads to the corresponding inner pads, respectively.

When an individual IC chip performs more and more functions, an increasing number of bump pads are required for signal input or signal output. Additionally, with advancement of manufacturing technology, the dimensions of the patterned metal layers and the internal elements in the IC chip can be further reduced, i.e., the entire area of the IC layered structure can be reduced. Therefore, improvement of the IC chip design is necessary in compliance with the current trend.

SUMMARY OF THE INVENTION

The invention is directed to an IC package which is capable of improving electrical performance.

The invention is further directed to a physical layer interface arrangement which is capable of improving electrical performance.

The invention provides an IC package that includes an IC chip, a package carrier, and a plurality of conductive bumps connecting the IC chip to the package carrier. The IC chip includes a substrate and an IC layered structure configured on an active surface of the substrate. The active surface has a core area and a signal area surrounding the core area. The IC layered structure includes a first physical layer interface. The first physical layer interface includes a plurality of first bump pads and a plurality of first inner pads electrically connected to the first bump pads, respectively. The first inner pads are arranged in multiple rows in the signal area.

The invention further provides a physical layer interface arrangement that includes the aforesaid first physical layer interface.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
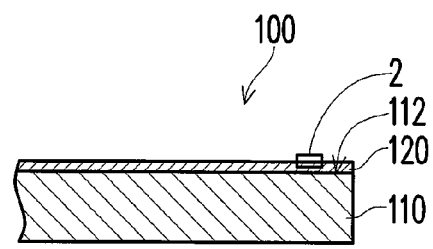
FIG. 1 is a partial cross-sectional view illustrating an IC chip according to an embodiment of the invention.
Figure 2:
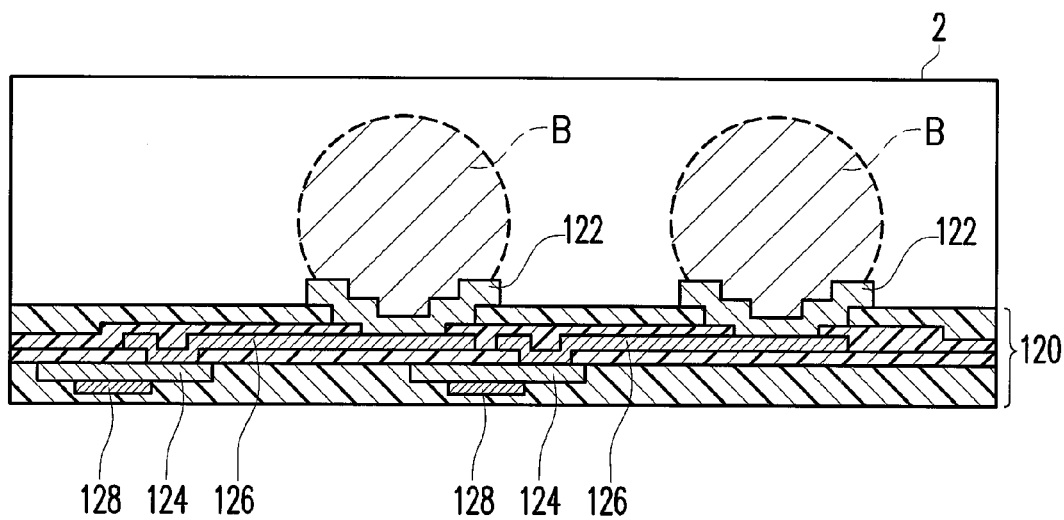
FIG. 2 is a locally enlarged view illustrating a portion 2 depicted in FIG. 1.

FIG. 1 is a partial cross-sectional view illustrating an IC chip according to an embodiment of the invention. FIG. 2 is a locally enlarged view illustrating a portion 2 depicted in FIG. 1. With reference to FIG. 1 and FIG. 2, in this embodiment, the IC chip 100 includes a substrate 110 and an IC layered structure 120. The substrate 110, for instance, is a silicon base and has an active surface 112. The IC layered structure 120 is configured on the active surface 112. The IC layered structure 120 includes a plurality of internal elements (e.g., MOS transistors, inductors, capacitors, and so on), a plurality of dielectric layers, and a plurality of patterned metal layers. In FIG. 1, these elements are not shown; only the IC layered structure marked by the reference number "120" is indicated. The IC layered structure 120 close to the external has a plurality of bump pads 122, a plurality of inner pads 124, and a plurality of redistribution lines 126, while two of the bump pads 122, two of the inner pads 124, and two of the redistribution lines 126 are depicted in FIG. 2. The bump pads 122 are located at the outermost portion of the IC layered structure 120 for accommodating conductive bumps B. Besides, the bump pads 122 are electrically connected to the inner pads 124 through the redistribution lines 126.

Figure 3:
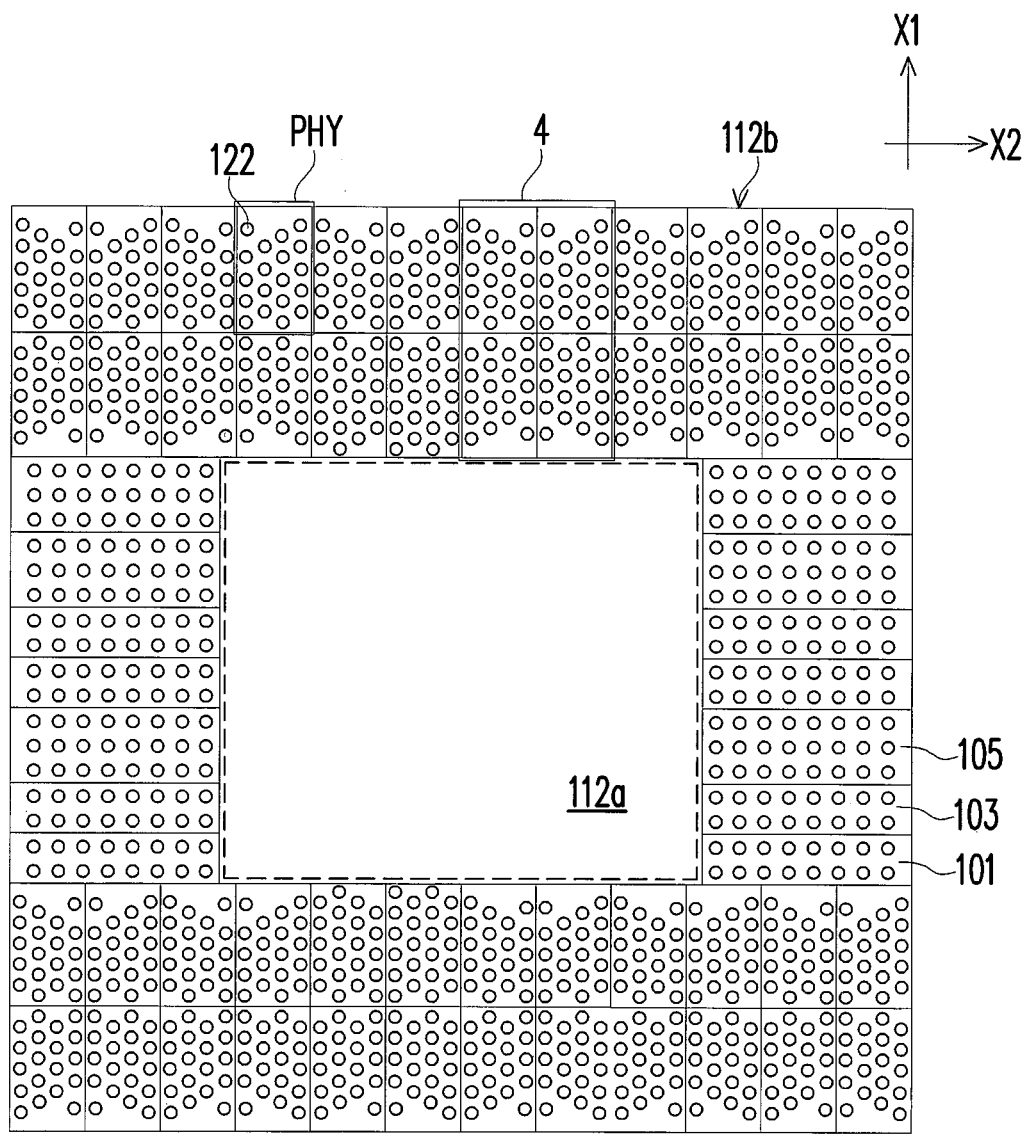
FIG. 3 is a schematic top view illustrating the IC chip depicted in FIG. 1

FIG. 3 is a schematic top view illustrating the IC chip depicted in FIG. 1. Namely, FIG. 3 shows the outermost portion of the IC layered structure 120. With reference to FIG. 1 and FIG. 3, the IC layered structure 120 includes a core area 112a and a signal area 112b surrounding the core area 112a. The active surface 112 includes a plurality of core power bump pads (not shown) and a plurality of core ground bump pads (not shown) in the core area 112a for power transmission and ground transmission. The IC layered structure 120 includes a plurality of physical layer interfaces PHYs in the signal area 112b for transmitting signals with specific functions. Several physical layer interfaces PHYs together constitute a physical layer interface arrangement (PHY arrangement). According to an embodiment, signal with different function can be transmitted through a physical layer interface PHY. According to another embodiment, the signals with the same function can be transmitted through several physical layer interfaces PHY. It should be mentioned that each of the physical layer interfaces PHYs may includes a plurality of bump pads 122, and the bump pads 122 may include signal bump pads, power bump pads, and ground bump pads. Unlike the core power bump pads and the core ground bump pads in the core area 112a, the power bump pads and the ground bump pads in the signal area 112b may merely be used for power transmission and ground transmission in the corresponding physical layer interfaces PHYs. Furthermore, the signal bump pads, the power bump pads in the signal area 112b may merely be used for I/O (Input/Output) signal transmission and I/O power transmission.

To be more specific, FIG. 2 illustrates a portion of one of the physical layer interfaces PHYs. Although each of the physical layer interfaces PHYs includes the bump pads 122, only two of the bump pads 122 are illustrated in FIG. 2. Besides, each of the physical layer interfaces PHYs further includes the inner pads 124 and the redistribution lines 126. In FIG. 2, two of the inner pads 124 and two of the redistribution lines 126 are shown. The inner pads 124 and the redistribution lines 126 are located below the corresponding bump pads 122 and in the IC layered structure 120 as shown in FIG. 1.

Figure 4:
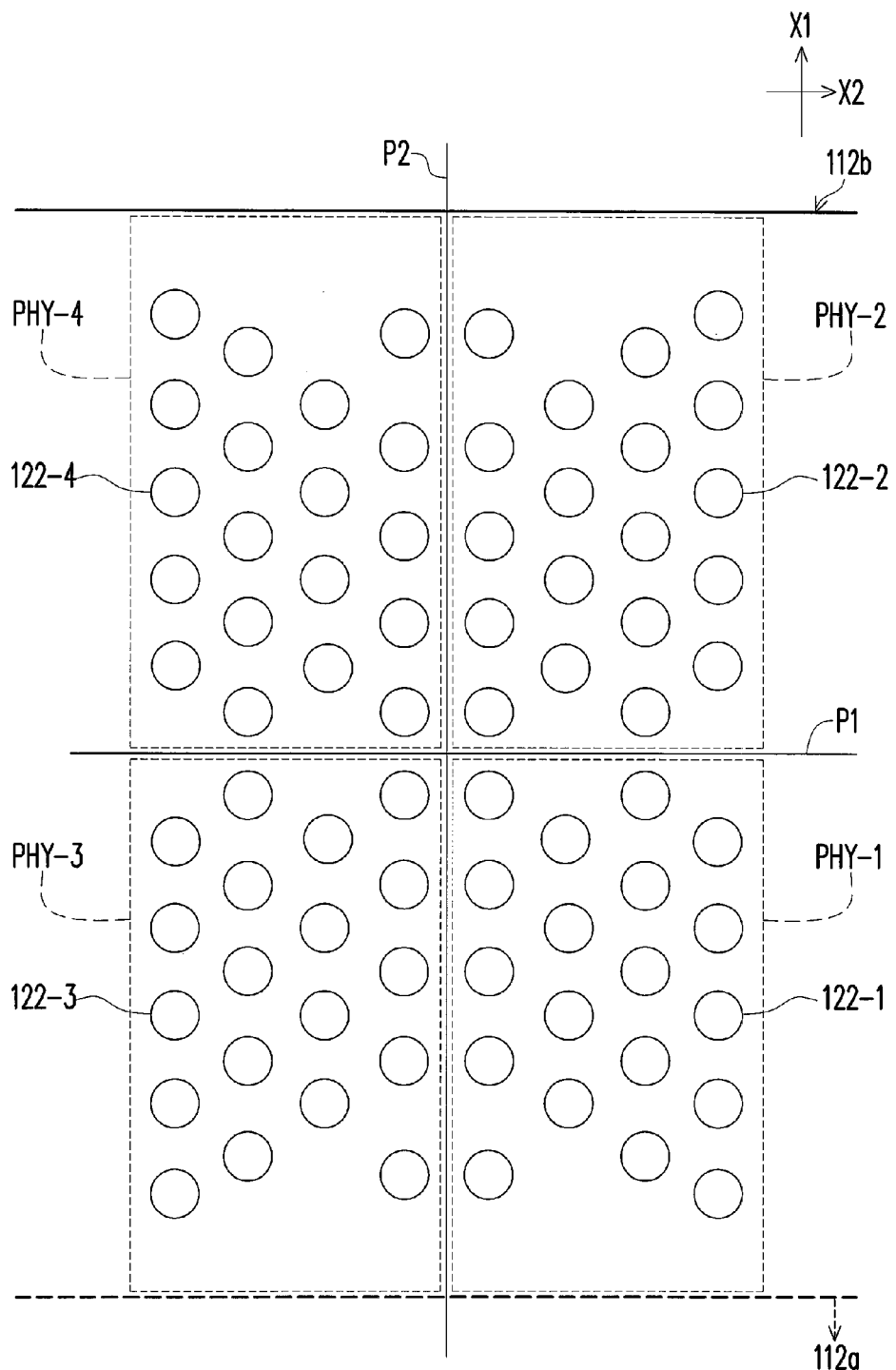
FIG. 4 illustrates bump pads of four physical layer interfaces in a portion 4 depicted in FIG. 3.

FIG. 4 illustrates bump pads of four physical layer interfaces PHYs in a portion 4 depicted in FIG. 3. The arrangement of the bump pads in the physical layer interfaces PHYs is merely exemplary and should not be construed as a limitation to the actual arrangement of the bump pads. With reference to FIG. 3 and FIG. 4, the IC layered structure 120 includes a first physical layer interface PHY-1 and a second physical layer interface PHY-2 that are arranged in double rows and located in the periphery of the core area 112a, i.e., in the signal area 112b. Besides, the second physical layer interface PHY-2 is a vertical mirror image of the first physical layer interface PHY-1. Here, the term "vertical" means that the second physical layer interface PHY-2 and the first physical layer interface PHY-1 are located in different rows. That is to say, in a direction X1, the distance from the second physical layer interface PHY-2 to the core area 112a is different from the distance from the first physical layer interface PHY-1 to the core area 112a. In particular, the first physical layer interface PHY-1 includes a plurality of first bump pads 122-1. The second physical layer interface PHY-2 includes a plurality of second bump pads 122-2. The second bump pads 122-2 are mirror images of the first bump pads 122-1 with respect to a first geometric plane P1 perpendicular to the active surface 112 depicted in FIG. 1. In detail, the first bump pads 122-1 can be signal bump pads, power bump pads, or ground bump pads, and the signal bump pads, power bump pads, or ground bump pads arranged in a mirror-symmetric manner with respect to the first geometric plane P1 are located in the second physical layer interface PHY-2.

According to this embodiment, the IC layered structure 120 can further include a third physical layer interface PHY-3 and a fourth physical layer interface PHY-4. The third physical layer interface PHY-3 and the first physical layer interface PHY-1 are arranged in the same row and located in the periphery of the core area 112a, i.e., in the signal area 112b, as shown in FIG. 3. Similarly, the fourth physical layer interface PHY-4 and the second physical layer interface PHY-2 are arranged in the same row and located in the periphery of the core area 112a, i.e., in the signal area 112b, as shown in FIG. 3. In other words, the first physical layer interface PHY-1, the second physical layer interface PHY-2, the third physical layer interface PHY-3, and the fourth physical layer interface PHY-4 are arranged in double rows and located in the periphery of the core area 112a, i.e., in the signal area 112b. The third physical layer interface PHY-3 and the fourth physical layer interface PHY-4 are horizontal mirror images of the first physical layer interface PHY-1 and the second physical layer interface PHY2, respectively. Here, the term "horizontal" means that the third physical layer interface PHY-3 and the first physical layer interface PHY-1 are located in the same row, or the fourth physical layer interface PHY-4 and the second physical layer interface PHY2 are located in the same row. Namely, in the direction X1, the distances from the two physical layer interfaces (such as PHY-1 and PHY-3) in the same row to the core area 112a are the same.

Specifically, the third physical layer interface PHY-3 includes a plurality of third bump pads 122-3, and the third bump pads 122-3 are mirror images of the first bump pads 122-1 with respect to a second geometric plane P2 perpendicular to the active surface 112 depicted in FIG. 1. The fourth physical layer interface PHY-4 includes a plurality of fourth bump pads 122-4, and the fourth bump pads 122-4 are mirror images of the second bump pads 122-2 with respect to the second geometric plane P2 perpendicular to the active surface 112 depicted in FIG. 1. In this embodiment, the first geometric plane P1 is perpendicular to the second geometric plane P2.

Note that the physical layer interfaces PHY-1, PHY-2, PHY-3, and PHY-4 are arranged in double rows. By contrast, the physical layer interfaces 101, 103, and 105 shown in FIG. 3 are arranged in a single row along the direction X1. Particularly, in this embodiment, the physical layer interfaces PHY-1 and PHY-3 are arranged in a single row in a direction X2, and the physical layer interfaces PHY-2 and PHY-4 are arranged in a single row in the direction X2 as well. As a whole, however, the physical layer interfaces PHY-1, PHY-2, PHY-3, and PHY-4 are arranged in double rows in the direction X1. In the conventional circuit design, the physical layer interfaces PHYs are arranged in a single row (like the arrangement of the physical layer interfaces 101, 103, and 105), which suffers from difficulty in reducing the entire chip size. With development of the manufacturing process, both pitch and line width can be reduced. Therefore, the area occupied by the core area 112a can be reduced, while the usable area of the signal area 112b can be expanded. As a result, the physical layer interfaces PHYs can be arranged in double rows.

In addition, at least two the physical layer interfaces PHYs (PHY-1, PHY-2, PHY-3, and PHY-4) arranged in a mirror-symmetric manner with respect to the geometric plane P1 (and the geometric plane P2) are applied to transmit the signals with a specific function. For instance, through the several physical layer interfaces PHYs, signals with function of double data rate (DDR) memory, signals with function of universal serial bus (USB), or signals with function of serial advanced technology attachment (SATA) can be transmitted. To be more specific, in the conventional design, the physical layer interfaces PHYs performing the same specific function are arranged in a single row (e.g., the arrangement of the physical layer interfaces 101, 103, and 105 in FIG. 3) and are not arranged in a mirror-symmetric manner. Thereby, in terms of signal transmission, the physical layer interfaces PHYs at different locations perform the same function while have different signal transmission paths, which negatively affects the transmission quality and even results in erroneous signal transmission. In this embodiment, if given several physical layer interfaces are designed to together perform the same function, the physical layer interfaces can be arranged in double rows and in a mirror-symmetric manner, as described in this embodiment. On the contrary, if given each of the physical layer interfaces is designed to perform a specific function, these physical layer interfaces can be arranged in a signal row (e.g., the arrangement of the physical layer interfaces 101, 103, and 105). Besides, the number of the physical layer interfaces PHYs arranged in double rows is not limited to four per unit. In an embodiment of the invention, six physical layer interfaces PHYs can be arranged in a vertical or horizontal mirror-symmetric manner. It means there are three physical layer interfaces PHYs in the same row.

Figure 5:
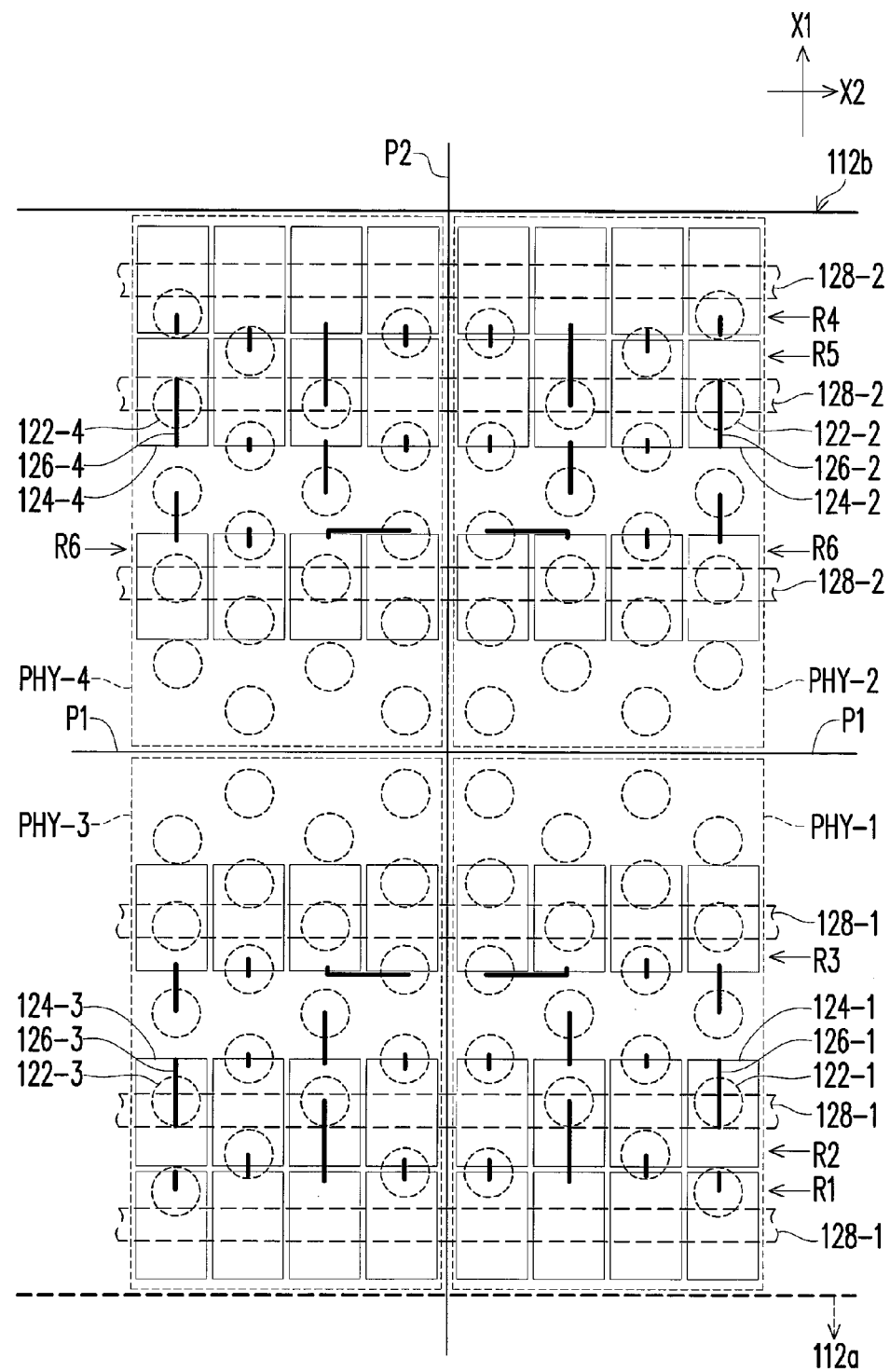
FIG. 5 illustrates inner pads and redistribution lines in the physical layer interfaces depicted in FIG. 4.

FIG. 5 illustrates inner pads and redistribution lines in the physical layer interfaces depicted in FIG. 4, while FIG. 2 is also a cross-sectional view showing an individual physical layer interface as well as the inner pads and the redistribution lines in the physical layer interface. With reference to FIG. 5, in this embodiment, the first physical layer interface PHY-1 further includes a plurality of first inner pads 124-1 that are arranged in multiple rows in the signal area 112*b*. The first inner pads 124-1 are arranged in three rows R1, R2, and R3, for instance. The row R1 is adjacent to the row R2, and there is a distance between the rows R2 and R3. In this embodiment, the first inner pads 124-1 can be in an oblong shape, particularly in a rectangular shape. The second physical layer interface PHY-2 further includes a plurality of second inner pads 124-2 that are arranged in multiple rows in the signal area 112*b*. The second inner pads 124-2 are arranged in three rows R4, R5, and R6, for instance. The row R4 is adjacent to the row R5, and there is a distance between the rows R5 and R6. In this embodiment, the second inner pads 124-2 can be in an oblong shape, particularly in a rectangular shape. The second inner pads 124-2 are mirror images of the first inner pads 124-1 with respect to the first geometric plane P1.

In this embodiment, the first physical layer interface PHY-1 can further include a plurality of first redistribution lines 126-1 which electrically connect the first bump pads 122-1 to the first inner pads 124-1, respectively. The second physical layer interface PHY-2 can further include a plurality of second redistribution lines 126-2 which electrically connect the second bump pads 122-2 to the second inner pads 124-2, respectively. The second redistribution lines 126-2 are minor images of the first redistribution lines 126-1 with respect to the first geometric plane P1.

Note that the inner pads are merely configured on an edge close to the physical layer interface in the conventional design of the physical layer interface, i.e., where the row R1 or R4 is located. However, with said conventional design, the bump pads close to the first geometric plane P1 must electrically connect to the inner pads in row R1 or R4 with the longer distribution lines, which may deteriorate the quality of signal transmission. In an individual physical layer interface of the present embodiment, the inner pads arranged in multiple rows are conducive to the reduction of the length of the redistribution lines between the corresponding bump pad and the corresponding inner pad, so as to ensure the favorable quality of signal transmission.

The third physical layer interface PHY-3 of this embodiment further includes a plurality of third inner pads 124-3, and the third inner pads 124-3 are minor images of the first inner pads 124-1 with respect to the second geometric plane P2. Similarly, the third inner pads 124-3 are arranged in multiple rows in the signal area 112*b*. The fourth physical layer interface PHY-4 of this embodiment further includes a plurality of fourth inner pads 124-4, and the fourth inner pads 124-4 are minor images of the second inner pads 124-2 with respect to the second geometric plane P2. Similarly, the fourth inner pads 124-4 are arranged in multiple rows in the signal area 112*b*.

In this embodiment, the third physical layer interface PHY-3 can further include a plurality of third redistribution lines 126-3 which electrically connect the third bump pads 122-3 to the third inner pads 124-3, respectively. The third redistribution lines 126-3 are mirror images of the first redistribution lines 126-1 with respect to the second geometric plane P2. The fourth physical layer interface PHY-4 can further include a plurality of fourth redistribution lines 126-4 which electrically connect the fourth bump pads 122-4 to the fourth inner pads 124-4, respectively. The fourth redistribution lines 126-4 are mirror images of the second redistribution lines 126-2 with respect to the second geometric plane P2.

In the present embodiment, it should be noted that the inner pads of this embodiment can be used for signal and power transmission so that the signal bump pads and the power bump pads are electrically and physically connected to the corresponding inner pads through the corresponding redistribution lines.

The IC layered structure 120 of this embodiment can further include a plurality of power rings 128-1 whose structures are similar to the structure of the power ring 128 depicted in FIG. 2. One of the power rings 128-1 is located below the first inner pads 124-1 arranged in the same row R1, R2, or R3, so as to supply voltage (not limit to power voltage) to the first physical layer interface PHY-1. One of the power rings 128-1 is located below the third inner pads 124-3 arranged in the same row R1, R2, or R3, so as to supply voltage (not limit to power voltage) to the third physical layer interface PHY-3. The IC layered structure 120 of this embodiment can further include a plurality of power rings 128-2 whose structures are also similar to the structure of the power ring 128 depicted in FIG. 2. One of the power rings 128-2 is located below the second inner pads 124-2 arranged in the same row R4, R5, or R6, so as to supply voltage (not limit to power voltage) to the second physical layer interface PHY-2. One of the power rings 128-2 is located below the fourth inner pads 124-4 arranged in the same row R4, R5, or R6, so as to supply voltage (not limit to power voltage) to the fourth physical layer interface PHY-4. Specifically, the power rings 128-1 and 128-2 are arranged in a mirror-symmetric manner with respect to the first geometric plane P1. As such, if the second physical layer interface PHY-2 or the fourth physical layer interface PHY-4 requires voltage supply, the voltage can be directly applied to the second physical layer interface PHY-2 or the fourth physical layer interface PHY-4 through the corresponding power rings 128-2 in the second physical layer interface PHY-2 or the fourth physical layer interface PHY-4 rather than through the power rings 128-1 which are in the first physical layer interface PHY-1 or in the third physical layer interface PHY-3 and have relatively long electrical transmission paths. Thereby, favorable electrical quality can be ensured. In addition, the present design that the power rings are arranged in multiple rows in an individual physical layer interface can further shorten the transmission path compared to the conventional design with just one power ring 128-1 in row R1 in the arrangement of the physical layer interfaces PHYs of FIG. 5. In another embodiment, a power plane or a power mesh can instead of the power rings 128-1 and 128-2 located below the inner pads 124-1, 124-3 arranged in the same row R1, R2, or R3 and the inner pads 124-2 and 124-4 arranged in the same row R4, R5, or R6.

It should be mentioned that the bump pads in each of the physical layer interfaces PHYs have the "narrow" distribution in the conventional design, while the bump pads in each of the physical layer interfaces PHYs have the "wide" distribution in the present embodiment. For instance, in the conventional design, if given the physical layer interface PHY shown in FIG. 3 (FIG. 3 does not exactly illustrates the number of the bump pads in one physical layer interface PHY) may have 24 bump pads, for instance, 8 of them are arranged in the direction X1 and 3 of them are arranged in the direction X2. In the other example of the conventional design, if given the physical layer interface PHY shown in FIG. 3 may have 24 bump pads, 12 of them are arranged in the direction X1 and 2 of them are arranged in the direction X2. The bump pads of the physical layer interface PHY in the conventional design are arranged like the above examples in order to reduce the width (in the direction X2) of each physical layer interface PHY, so as to reduce both the size of the physical layer interface PHY and the area of the chip. By contrast, since the physical layer interfaces PHYs are arrangement in the two rows in the signal area of this embodiment, the usable area of the signal area is expanded compared with the single row of the conventional design. Accordingly, it is likely to arrange 6 of the bump pads in the direction X1 and 4 of the bump pads in the direction X2 if given the physical layer interface PHY shown in FIG. 3 may have 24 bump pads. Thereby, when the bump pads are connected to the corresponding inner pads through the redistribution lines, the length (in the direction X1) of the longest redistribution line of the physical layer interface PHY between corresponding to the bump pad and the inner pad can be reduced, so as to shorten the transmission path and prevent signal decay. Moreover, the inner pads are further arranged in multiple rows in the physical layer interface PHY according to this invention, and thus the length of the redistribution lines can be further shortened.

The first bump pads 122-1 of this embodiment include a plurality of signal bump pads, a plurality of power bump pads, and a plurality of ground bump pads, and a ratio of the number of the signal bump pads to the number of the power bump pads ranges from 2 to 8 depending on the design demand. Due to the structural and electrical mirror-symmetric manner, a ratio of the number of the signal bump pads to the number of the power bump pads of the second bump pads 122-2, the third bump pads 122-3, or the fourth bump pads 122-4 also ranges from 2 to 8.

With reference to FIG. 3 and FIG. 5, there are four physical layer interfaces PHYs as described in the previous embodiments, which should not be construed as a limitation to the invention. The design of the physical layer interface PHY-1, PHY-2, PHY-3, or PHY-4 depicted in FIG. 5 can also be applied to the exemplary individual physical layer interface 101, 103, or 105 that is depicted in FIG. 3 and has the single-row arrangement. That is to say, the inner pads in the individual physical layer interface 101, 103, or 105 can be arranged in multiple rows in the signal area 112b. The power rings corresponding to the inner pads are also likely to be arranged in multiple rows. As such, the physical layer interfaces in a single row can also have the shortened signal transmission path, so as to ensure the favorable quality of signal transmission.

Figure 6:
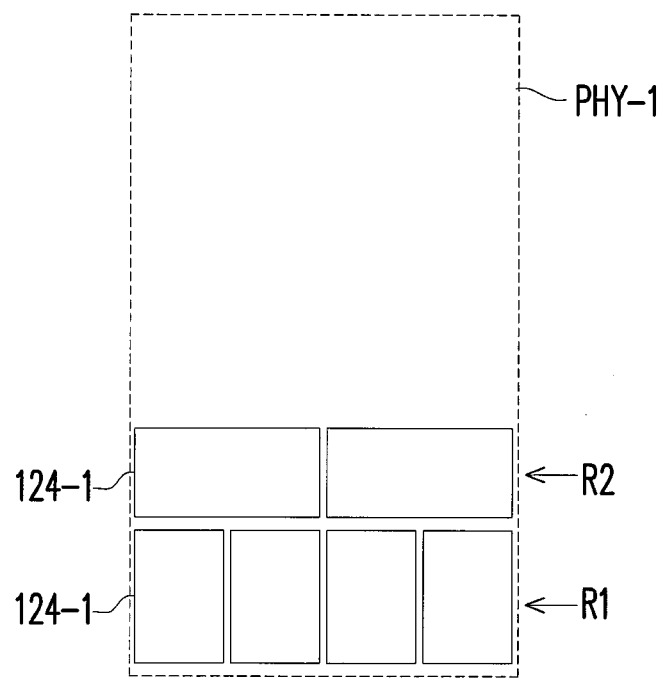
FIG. 6 illustrates the arrangement of inner pads according to another embodiment of the invention.

FIG. 6 illustrates the arrangement of inner pads according to another embodiment of the invention. In FIG. 5, a length direction of the first inner pads 124-1 in the first physical layer interface PHY-1 is perpendicular to an extension direction of the rows R1, R2, and R3. By contrast, as shown in FIG. 6, the length direction of the first inner pads 124-1 arranged in the same row R1 is perpendicular to the extension direction of the row R1, while the length direction of the first inner pads 124-1 arranged in the row R2 is parallel to the extension direction of the row R2.

Figure 7:
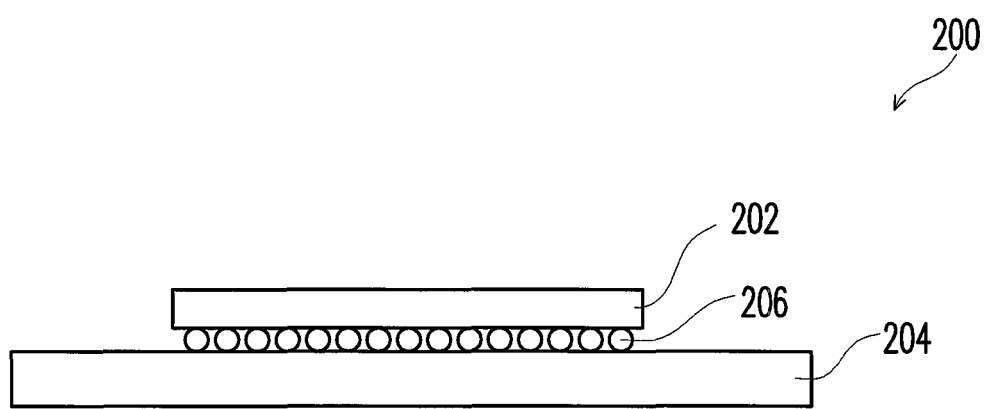
FIG. 7 is a side view illustrating an IC package according to another embodiment of the invention.

FIG. 7 is a side view illustrating an IC package according to another embodiment of the invention. With reference to FIG. 7, in this embodiment, the IC package 200 includes an IC chip 202, a package carrier 204, and a plurality of conductive bumps 206. The IC chip 202 is the same as the IC chip 100 shown in FIG. 1, and the IC chip 202 is connected to the package carrier 204 through the conductive bumps 206. The package carrier 204 of this embodiment can be a coreless wired board. The so-called coreless wired board is a circuit board in which a dielectric layer is made of glass-fiber-free resin, which is conducive to the size reduction of conductive through vias and the increase in the wiring density of the circuit board. Thereby, a chip package process can be performed on the physical layer interfaces PHYs arranged in double rows when the package carrier of this invention is the coreless wired board.

In light of the foregoing, the inner pads are arranged in multiple rows in the physical layer interface PHY, so as to shorten the path of the electric current and improve the electrical performance. Moreover, through a vertical or horizontal mirror-symmetric manner, a physical layer interface is duplicated at a side to form a physical layer interface arrangement, which is also conducive to improvement of electrical performance. In addition, since the physical layer interfaces of this embodiment are arranged in double rows in the signal area of the active surface, the signal transmission path can be shortened, and the chip size can be reduced.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. An integrated circuit package comprising:
an integrated circuit chip;
a package carrier; and
a plurality of conductive bumps, the integrated circuit chip being connected to the package carrier through the conductive bumps,
the integrated circuit chip comprising:
a substrate having an active surface, the active surface having a core area and a signal area surrounding the core area; and
an integrated circuit layered structure configured on the active surface and the integrated circuit layered structure comprising:
a first physical layer interface comprising:
a plurality of first bump pads; and a plurality of first inner pads electrically connected to the first bump pads, respectively, wherein the first inner pads are arranged in multiple rows in the signal area; and a second physical layer interface comprising:
a plurality of second bump pads; and
a plurality of second inner pads arranged in multiple rows in the signal area and electrically connected to the second bump pads, respectively, wherein the second physical layer interface in the signal area is directly adjacent to the first physical layer interface in the signal area, the core area has four straight sides, the first and second physical layer interfaces are located at only one of the four straight sides of the core area, the second bump pads are minor images of the first bump pads with respect to a first geometric plane perpendicular to the active surface, and the second inner pads are mirror images of the first inner pads with respect to the first geometric plane.

2. The integrated circuit package as claimed in claim 1, wherein a length direction of the first inner pads arranged in one row is perpendicular to an extension direction of the one row, a length direction of the first inner pads arranged in another row is parallel to an extension direction of the another row, and the length dimension of each of the first inner pads is longer than a width dimension of the corresponding first inner pad.

3. The integrated circuit package as claimed in claim 1, wherein the integrated circuit layered structure further comprising a plurality of power rings, one of the power rings being correspondingly configured below the first inner pads arranged in one row.

4. The integrated circuit package as claimed in claim 1, wherein the first bump pads comprise a plurality of signal bump pads and a plurality of power bump pads, and a ratio of the number of the signal bump pads to the number of the power bump pads ranges from 2 to 8.

5. A physical layer interface arrangement suitable for being configured above an active surface of a substrate of an integrated circuit chip, the active surface having a core area and a signal area surrounding the core area, the physical layer interface arrangement comprising:

a first physical layer interface comprising:
a plurality of first bump pads; and
a plurality of first inner pads electrically connected to the first bump pads, respectively, wherein the first inner pads are arranged in multiple rows in the signal area; and a second physical layer interface comprising:
a plurality of second bump pads; and
a plurality of second inner pads arranged in multiple rows in the signal area and electrically connected to the second bump pads, respectively, wherein the second physical layer interface in the signal area is directly adjacent to the first physical layer interface in the signal area, the core area has four straight sides, the first and second physical layer interfaces are located at only one of the four straight sides of the core area, the second bump pads are mirror images of the first bump pads with respect to a first geometric plane perpendicular to the active surface, and the second inner pads are mirror images of the first inner pads with respect to the first geometric plane.

6. The physical layer interface arrangement as claimed in claim 5, wherein a length direction of the first inner pads arranged in one row is perpendicular to an extension direction of the one row, a length direction of the first inner pads arranged in another row is parallel to an extension direction of the another row, and the length dimension of each of the first inner pads is longer than a width dimension of the corresponding first inner pad.

7. The physical layer interface arrangement as claimed in claim 5, further comprising a plurality of power rings, one of the power rings being correspondingly configured below the first inner pads arranged in one row.

8. The physical layer interface arrangement as claimed in claim 5, further comprising a plurality of first power rings and a plurality of second power rings, one of the first power rings being correspondingly configured below the first inner pads arranged in one row, one of the second power rings being correspondingly configured below the second inner pads arranged in one row, the second power rings are mirror images of the first power rings with respect to the first geometric plane perpendicular to the active surface.

9. The physical layer interface arrangement as claimed in claim 5, wherein
the first physical layer interface further comprising:
a plurality of first redistribution lines electrically connecting the first bump pads to the first inner pads, respectively;
the second physical layer interface further comprising:
a plurality of second redistribution lines electrically connecting the second bump pads to the second inner pads, respectively,
wherein the second redistribution lines are mirror images of the first redistribution lines with respect to the first geometric plane.

10. The physical layer interface arrangement as claimed in claim 5, further comprising:
a third physical layer interface comprising:
a plurality of third bump pads; and
a plurality of third inner pads arranged in multiple rows in the signal area and electrically connected to the third bump pads, respectively; and
a fourth physical layer interface directly adjacent to the third physical layer interface, comprising:
a plurality of fourth bump pads; and
a plurality of fourth inner pads arranged in multiple rows in the signal area and electrically connected to the fourth bump pads, respectively,
wherein the first, second, third and fourth physical layer interfaces are located at the only one of the four straight sides of the core area, the third bump pads are mirror images of the first bump pads with respect to a second geometric plane perpendicular to the first geometric plane and the active surface, the third inner pads are minor images of the first inner pads with respect to the second geometric plane,
the fourth bump pads are mirror images of the second bump pads with respect to the second geometric plane, and the fourth inner pads are minor images of the second inner pads with respect to the second geometric plane.

11. The physical layer interface arrangement as claimed in claim 10, further comprising a plurality of first power rings and a plurality of second power rings, one of the first power rings being correspondingly configured below the first inner pads and the third inner pads arranged in one row, one of the second power rings being correspondingly configured below the second inner pads and the fourth inner pads arranged in one row, the second power rings being mirror images of the first power rings with respect to the first geometric plane perpendicular to the active surface.

12. The physical layer interface arrangement as claimed in claim 10, further comprising a power plane or a power mesh configured below the first inner pads, the second inner pads, the third inner pads and the fourth inner pads.

13. The physical layer interface arrangement as claimed in claim 5, wherein the first bump pads comprise a plurality of signal bump pads and a plurality of power bump pads, and a ratio of the number of the signal bump pads to the number of the power bump pads ranges from 2 to 8.

14. An integrated circuit package comprising:
an integrated circuit chip;
a package carrier; and
a plurality of conductive bumps, the integrated circuit chip being connected to the package carrier through the conductive bumps,
the integrated circuit chip comprising:
a substrate having an active surface, the active surface having a core area and a signal area surrounding the core area; and
an integrated circuit layered structure configured on the active surface and the integrated circuit layered structure comprising:
a first physical layer interface comprising:
a plurality of first bump pads; and
a plurality of first inner pads electrically connected to the first bump pads, respectively, wherein the first inner pads are arranged in multiple rows in the signal area; and
a second physical layer interface comprising:
a plurality of second bump pads; and
a plurality of second inner pads arranged in multiple rows in the signal area and electrically connected to the second bump pads, respectively,
wherein the second physical layer interface in the signal area is directly adjacent to the first physical layer interface in the signal area, the core area has four straight sides, the first and second physical layer interfaces are located at only one of the four straight sides of the core area, the second bump pads are minor images of the first bump pads with respect to a first geometric plane perpendicular to the active surface, and the second inner pads are minor images of the first inner pads with respect to the first geometric plane.

15. The integrated circuit package as claimed in claim 14, wherein the integrated circuit layered structure further comprises a plurality of first power rings and a plurality of second power rings, one of the first power rings is correspondingly configured below the first inner pads arranged in one row, one of the second power rings is correspondingly configured below the second inner pads arranged in one row, and the second power rings are mirror images of the first power rings with respect to the first geometric plane perpendicular to the active surface.

16. The integrated circuit package as claimed in claim 14, wherein the integrated circuit layered structure further comprises:
the first physical layer interface further comprising:
a plurality of first redistribution lines electrically connecting the first bump pads to the first inner pads, respectively; and
the second physical layer interface further comprising:
a plurality of second redistribution lines electrically connecting the second bump pads to the second inner pads, respectively,
wherein the second redistribution lines are mirror images of the first redistribution lines with respect to the first geometric plane.

17. The integrated circuit package as claimed in claim 14, wherein the integrated circuit layered structure further comprises:
a third physical layer interface comprising:
a plurality of third bump pads; and
a plurality of third inner pads arranged in multiple rows in the signal area and electrically connected to the third bump pads, respectively; and
a fourth physical layer interface directly adjacent to the third physical layer interface, comprising:
a plurality of fourth bump pads; and
a plurality of fourth inner pads arranged in multiple rows in the signal area and electrically connected to the fourth bump pads, respectively,
wherein the first, second, third and fourth physical layer interfaces are located at the only one of the four straight sides of the core area, the third bump pads are mirror images of the first bump pads with respect to a second geometric plane perpendicular to the first geometric plane and the active surface, the third inner pads are mirror images of the first inner pads with respect to the second geometric plane,
the fourth bump pads are mirror images of the second bump pads with respect to the second geometric plane, and the fourth inner pads are mirror images of the second inner pads with respect to the second geometric plane.

18. The integrated circuit package as claimed in claim 17, wherein the integrated circuit layered structure further comprises a plurality of first power rings and a plurality of second power rings, one of the first power rings is correspondingly configured below the first inner pads and the third inner pads arranged in one row, one of the second power rings is correspondingly configured below the second inner pads and the fourth inner pads arranged in one row, and the second power rings are mirror images of the first power rings with respect to the first geometric plane perpendicular to the active surface.

19. The integrated circuit package as claimed in claim 17, wherein the integrated circuit layered structure further comprises a power plane or a power mesh configured below the first inner pads, the second inner pads, the third inner pads and the fourth inner pads.

* * * * *